US012724088B2

(12) United States Patent
Hager

(10) Patent No.: US 12,724,088 B2
(45) Date of Patent: Sep. 1, 2026

(54) METHOD AND DEVICE FOR DETECTING A SHORT CIRCUIT OF A SEMICONDUCTOR SWITCH ELEMENT IN AN INVERTER FOR ENERGIZING AN ELECTRIC DRIVE IN AN ELECTRIC VEHICLE OR HYBRID VEHICLE; INVERTER COMPRISING SUCH A DEVICE

(71) Applicant: ZF Friedrichshafen AG, Friedrichshafen (DE)

(72) Inventor: Johannes Hager, Marktleugast (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 138 days.

(21) Appl. No.: 18/684,584

(22) PCT Filed: Aug. 17, 2022

(86) PCT No.: PCT/EP2022/072955
§ 371 (c)(1),
(2) Date: Feb. 16, 2024

(87) PCT Pub. No.: WO2023/021087
PCT Pub. Date: Feb. 23, 2023

(65) Prior Publication Data

US 2024/0377475 A1 Nov. 14, 2024

(30) Foreign Application Priority Data

Aug. 19, 2021 (DE) ..................... 10 2021 209 141.5

(51) Int. Cl.
*G01R 31/52* (2020.01)
*B60L 3/00* (2019.01)
*G01R 31/42* (2006.01)

(52) U.S. Cl.
CPC .............. *G01R 31/42* (2013.01); *B60L 3/003* (2013.01); *G01R 31/52* (2020.01)

(58) Field of Classification Search
CPC .......... G01R 31/42; G01R 31/52; B60L 3/003
See application file for complete search history.

(56) References Cited

U.S. PATENT DOCUMENTS

2009/0284198 A1* 11/2009 Shimana ................ G01R 31/42 180/65.285
2010/0036555 A1* 2/2010 Hosoda ..................... B60L 3/04 180/65.21

(Continued)

FOREIGN PATENT DOCUMENTS

DE 10 2017 103 326 A1 8/2017
DE 10 2016 220 030 A1 4/2018

(Continued)

OTHER PUBLICATIONS

International Search Report and Written Opinion received for Application No. PCT/EP2022/072955 mailed Dec. 15, 2022 (10 pages).

(Continued)

*Primary Examiner* — Lee E Rodak
*Assistant Examiner* — Demetrius R Pretlow
(74) *Attorney, Agent, or Firm* — Crowell & Moring LLP

(57) ABSTRACT

A method for detecting a short circuit of a semiconductor switch element in an inverter comprises comprising a plurality of semiconductor switch elements forming a high side and a low side, wherein the high and low sides comprise respective semiconductor switch elements connected in parallel, and the high and low sides are connected in parallel to form an intermediate circuit capacitor. The method includes measuring an intermediate circuit voltage applied to the intermediate circuit capacitor; determining an intermediate circuit capacitance of the intermediate circuit capacitor;

(Continued)

Figure 1:
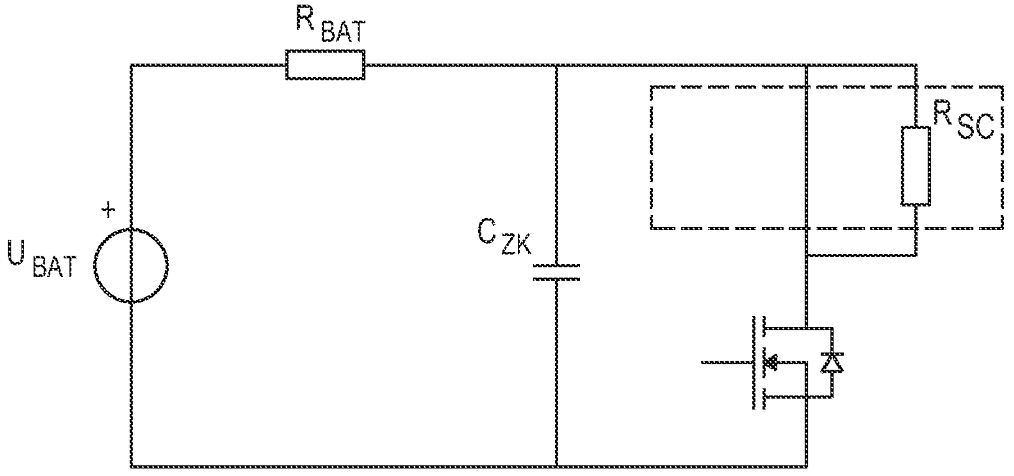

determining a short circuit resistance of the inverter; ascertaining a time constant from the intermediate circuit capacitance and the short circuit resistance, by multiplying the intermediate circuit capacitance by the short circuit resistance; ascertaining a change in the measured intermediate circuit voltage within the ascertained time constant to calculate a change rate; and comparing the change rate with a first threshold.

9 Claims, 1 Drawing Sheet

(56) References Cited

U.S. PATENT DOCUMENTS

2012/0242365 A1 9/2012 Singh
2016/0124037 A1 5/2016 Zhang et al.

FOREIGN PATENT DOCUMENTS

EP 3 754 346 A1 12/2020
JP 2012-120436 A 6/2012

OTHER PUBLICATIONS

Office Action dated Jun. 17, 2022 for German Patent Application No. 10 2021 209 141.5 (10 pp.), note: pp. 1 and 2 are English language Explanations to Section C. Result of Determination Document.

* cited by examiner

METHOD AND DEVICE FOR DETECTING A SHORT CIRCUIT OF A SEMICONDUCTOR SWITCH ELEMENT IN AN INVERTER FOR ENERGIZING AN ELECTRIC DRIVE IN AN ELECTRIC VEHICLE OR HYBRID VEHICLE; INVERTER COMPRISING SUCH A DEVICE

CROSS-REFERENCE TO RELATED APPLICATIONS

This application is a U.S. national stage application under 35 U.S.C. § 371 of PCT Application No. PCT/EP2022/072955, filed on Aug. 17, 2022, and published as WO 2023/021087 A1 on Feb. 23, 2023, which claims priority from German Application No. DE 10 2021 209 141.5, filed on Aug. 19, 2021, the entirety of which are each hereby fully incorporated by reference herein.

The invention relates to a method and a device for detecting a short circuit of a semiconductor switch in an inverter. The inverter supplies power to an electric drive in an electric vehicle or hybrid vehicle. The invention also relates to an inverter containing this device.

There are both purely electric vehicles and hybrid vehicles in the prior art that are driven exclusively or in part by one or more electric machines that serve as the drive units. These electric vehicles and hybrid vehicles have energy storage units, specifically rechargeable batteries, with which the electric machines in the electric vehicles or hybrid vehicles are supplied with electricity. The batteries supply DC voltage. The electric machines normally require AC voltage. For this reason, power electronics with a so-called inverter are normally interconnected between the batteries and electric machines in electric vehicles and hybrid vehicles.

These inverters normally contain semiconductor switches in the form of transistors. The semiconductor switches can have different degrees of integration, specifically as discrete switches with a low degree of integration but with a higher scalability, as power modules with a high degree of integration but lower scalability, or as half bridges, which are somewhere between individual switches and half bridges with regard to the degree of integration and scalability. Each half bridge comprises a high side switching position (hereinafter: “high side”) with a higher electrical potential, and a low side switching position (hereinafter “low side”) with a lower electrical potential. The high side and low side can each contain one or more individual switches or semiconductor switches, which are connected in parallel.

Depending on the design of the semiconductor switch, when current is applied thereto the semiconductor switch can be switched off or on. The semiconductor switch is preferably switched in accordance with a pulse-width modulation (PWM) in this manner, in order to obtain a sine curve in the phase currents. Consequently, an input direct current can be converted to a multi-phase output current (AC) with numerous current phases with which an electric drive in an electric vehicle or hybrid vehicle can be powered.

When the inverter is in operation, one or more of the semiconductor switches can short circuit. These short circuits can result in the semiconductor switches burning out, thus compromising the current conversion by the inverter. There are methods in the prior art for detecting these short circuits. These methods are based on an evaluation of the forward voltage passing through the semiconductor switches when they are switched on. This can take place for example through a direct drain-source or collector-emitter voltage measurement, or the so-called “Desat methode” [EN: desaturation fault detection]. If the forward voltage in one of the high sides or low sides of a semiconductor switch in a half bridge exceeds a preset threshold, it is assumed that a second semiconductor switch (low impedance) lying opposite the high side or low side in a first semiconductor switch in the same half bridge is defective, or that another element in the second semiconductor switch has short circuited.

The detection threshold is selected such that a false detection of a short circuit never occurs during normal operation of the semiconductor switch. The threshold must therefore be set such that any fluctuations in the forward voltage due to tolerances as a result of the switching characteristics, operating temperatures, and/or control voltage in the semiconductor switch can be sufficiently taken into account. The disadvantage with this is that when the inverter is in operation for longer periods of time, the preset forward voltage threshold is no longer adequate, such that in this state, the semiconductor switch is in danger of becoming damaged.

The object of the invention is to create a method and a device for detecting a short circuit of a semiconductor switch in an inverter in which the aforementioned disadvantages are at least partially overcome.

This is achieved according to the invention by the method, the device, and the inverter described in the independent claims. Advantageous embodiments and developments of the invention can be derived from the dependent claims.

The invention relates to an inverter with which the electric drive in an electric vehicle or hybrid vehicle is supplied with electricity. The inverter comprises numerous half bridges, each of which corresponds to a phase of the output multi-phase alternating current. By way of example, the inverter comprises three half bridges, each of which is dedicated to one of the phases of the three-phase output current. The output current is an alternating current generated from an input direct current by means of targeted switching of the semiconductor switches.

The half bridges each have a high side and a low side. The high side and low side each comprise one or more semiconductor switches connected in parallel. The semiconductor switches are preferably placed on a substrate. This substrate can be a Direct Bonded Copper (DBC) substrate, Direct Plated Copper (DPC) substrate, Active Metal Brazed (AMB) substrate, or Insulated Metal (IM) substrate. The substrate is preferably rectangular, in particular in the form of a flat, plate-like rectangle with two pairs of opposing sides. The substrate can be square. The back of the substrate, i.e. the side opposite the semiconductor switches, can be attached to a heat sink, in order to cool the semiconductor switches while the half bridges or power module/inverter are in operation.

The high side allows current to flow between an AC power connection and a DC plus power connection. The low side allows current to flow between the AC power connection and a DC minus power connection. The high side and low side are connected in series. Depending on the type of semiconductor switch, when power is applied to the signal contact on the semiconductor switch, it can be switched on or off. The semiconductor switches are preferably switched in accordance with a pulse-width modulation (PWM) in this manner, in order to obtain a sine curve in the phase currents.

The high side and low side are connected in parallel to an intermediate circuit capacitor in the inverter. The intermediate circuit capacitor is connected by a cable to a battery for the electric drive. According to the invention, the voltage at the intermediate circuit capacitor, the intermediate circuit voltage, is used for detecting a high impedance short circuit of a semiconductor switch. In one step of the method, the intermediate circuit capacitance of the intermediate circuit capacitor is determined. This can take place by reading a predetermined value for the intermediate circuit capacitance (provided by the manufacturer). Alternatively, the intermediate circuit capacitance can be measured or calculated. In another step, a short circuit resistance of the inverter is determined. The short circuit resistance is the impedance resistance formed in the inverter through the semiconductor switch when the semiconductor switch is short circuited. The short circuit resistance can be estimated. Alternatively, premeasured values can be used. In another step, a time constant is determined from the previously determined intermediate circuit capacitance and the previously established short circuit resistance. In another step, the intermediate circuit voltage at the intermediate circuit capacitor is measured, and a change in the intermediate circuit voltage within the previously determined time constant is determined. A speed of change is obtained in this manner. In another step, the speed of change is compared with a first threshold value. If the speed of change exceeds the first threshold value, it is assumed that a high impedance short circuit has occurred in the semiconductor switch. A corresponding detection signal is preferably generated in this case.

High impedance short circuits in an inverter can be particularly easily and reliably detected in this manner. Because the short circuit detection is based on monitoring the intermediate circuit voltage and its evaluation, it is possible to detect these short circuits in realtime. Furthermore, the method according to the invention takes the normal magnitudes of time into account with which changes in load are regulated during the normal operation of an inverter. The resulting time constant is ideal for determining the speed of change in the intermediate circuit capacitor. A lower time constant would require more data points from the measurement of the intermediate circuit capacitance, thus requiring more computing in the data processing. A larger time constant decreases the precision of the results.

According to one embodiment, the method also comprises model-based prediction of an expected change in the intermediate circuit voltage within the established time constant. The method also preferably comprises comparison of the predicted change in the intermediate circuit voltage with the measured change in the intermediate circuit voltage. The aforementioned threshold value with which the measured speed of change is compared can be optimized in this manner. The precision of the short circuit detection is increased by this.

According to another embodiment, the method also comprises comparing a measured absolute value for the intermediate circuit voltage with a second threshold value. If the absolute value of the intermediate circuit voltage exceeds the second threshold value, it is assumed that a high impedance short circuit has occurred in a semiconductor switch. This expanded detection means increases the reliability of the detection results.

The device for detecting a short circuit of a semiconductor switch in an inverter according to the invention is designed to execute the method according to the invention. The device can be an analog or digital circuit. The device can also be part of a microcontroller, or it can interact with a microcontroller. The device can also be a programmable logic circuit and/or field-programmable gate array.

The invention also relates to an inverter for an electric drive in an electric vehicle or hybrid vehicle, which contains such a power module. The advantages described in conjunction with the half bridges according to the invention also apply to the power module according to the invention and the inverter according to the invention.

The invention shall be explained below in reference to the embodiments shown in the drawings.

Figure 2:
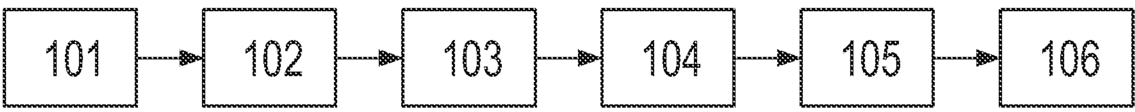

Therein:

FIG. 1 shows a schematic circuit diagram for an inverter, in which a short circuit in a semiconductor switch is illustrated; and FIG. 2 shows a schematic flow chart of a method for detecting a short circuit.

Identical objects, functional units and comparable components have the same reference symbols in all of the drawings. These objects, functional units, and comparable components are identical with regard to their technical features as long as it is not otherwise indicated, explicitly or implicitly, in the description.

FIG. 1 shows a schematic circuit diagram of an inverter with which an electric drive in an electric vehicle and/or hybrid vehicle is supplied with electricity. The inverter comprises two semiconductor switches in this highly simplified illustration, which collectively form a half bridge. A first semiconductor switch functions as the high side, and the second semiconductor switch functions as the low side. The inverter also comprises an intermediate circuit capacitor, which is connected in parallel to the half bridge. The intermediate circuit capacitor has an intermediate circuit capacitance CZK. A DC voltage source (e.g. a battery) generates a DC voltage UBAT and has an inner resistance RBAT. In this circuit diagram, the first semiconductor switch is crossed out to illustrate a short circuit thereof. A short circuit resistance RSC is also indicated that occurs when the first semiconductor switch short circuits.

FIG. 2 shows a schematic illustration of a method for detecting a short circuit. In step 101, the intermediate circuit capacitance CZK of the intermediate circuit capacitor is determined. In another step 102, the short circuit resistance RSC of the inverter is determined. The two steps 101, 102 do not necessarily have to be executed in this order, and instead can be reversed. In a third step 103, a time constant is determined from the intermediate circuit capacitance CZK and the short circuit resistance RSC. The time constant is preferably obtained by multiplying the intermediate circuit capacitance CZK with the short circuit resistance RSC. In a fourth step 104, the voltage at the intermediate circuit capacitor is measured. A change in the measured intermediate circuit voltage within the previously determined time constant is subsequently determined in a fifth step 105 in order to calculate a speed of change. The speed of change is then compared with a first threshold value in the last step 106. If the speed of change exceeds the first threshold value, it is assumed that a high impedance short circuit has occurred in the semiconductor switch. A detection signal is then preferably generated in this case.

REFERENCE SYMBOLS

101-106 steps of the method

The invention claimed is:

1. A method for detecting a short circuit of a semiconductor switch in an inverter that is designed to operate an electric drive in an electric vehicle or hybrid vehicle and comprises numerous semiconductor switches, wherein the semiconductor switches form a high side and a low side, wherein the high side and low side each comprise a plurality of semiconductor switches connected in parallel, wherein the high side and low side are connected in parallel to an intermediate circuit capacitor in the inverter, wherein the method comprises:

measuring an intermediate circuit voltage at the intermediate circuit capacitor;

determining an intermediate circuit capacitance in the intermediate circuit capacitor;

determining a short circuit resistance in the inverter;

setting a time constant from the intermediate circuit capacitance and the short circuit resistance by multiplying the intermediate circuit capacitance with the short circuit resistance;

determining a change in the intermediate circuit voltage within the set time constant in order to calculate a speed of change;

comparing the speed of change with a first threshold value; and determining that a short circuit of the semiconductor switch has occurred when the speed of change exceeds the first threshold value, and in response, switching the semiconductor switch off.

2. The method according to claim 1, comprising:

model-based prediction of an expected change in the intermediate circuit voltage within the set time constant.

3. The method according to claim 2, comprising:

comparing a predicted change in the intermediate circuit voltage with the measured change in the intermediate circuit voltage.

4. The method according to claim 1, comprising:

comparing a measured absolute value of the intermediate circuit voltage with a second threshold value.

5. A device for detecting a short circuit of a semiconductor switch in an inverter that is designed to operate an electric drive in an electric vehicle or a hybrid vehicle and comprises numerous semiconductor switches, wherein the semiconductor switches form a high side and a low side, wherein the high side and low side each comprise a plurality of semiconductor switches connected in parallel, wherein the high side and low side are connected in parallel to an intermediate circuit capacitor in the inverter, wherein the device is configured to:

measure an intermediate circuit voltage at the intermediate circuit capacitor;

determine an intermediate circuit capacitance in the intermediate circuit capacitor;

determine a short circuit resistance in the inverter;

set a time constant from the intermediate circuit capacitance and the short circuit resistance by multiplying the intermediate circuit capacitance with the short circuit resistance;

determine a change in the intermediate circuit voltage within the set time constant in order to calculate a speed of change;

compare the speed of change with a first threshold value; and determine that a short circuit of the semiconductor switch has occurred when the speed of change exceeds the first threshold value, and in response, switch the semiconductor switch off.

6. The device according to claim 5, wherein the device is an analog or digital circuit.

7. The device according to claim 5, wherein the device is part of a microcontroller or is configured to interact with a microcontroller.

8. The device according to claim 5, wherein the device is a programmable logic circuit and/or field-programmable gate array.

9. An inverter for an electric drive in an electric vehicle or hybrid vehicle, comprising the device according to claim 5.

* * * * *